United States Patent
Miura (10) Patent No.: US 8,368,215 B2
(45) Date of Patent: Feb. 5, 2013

(54) SEMICONDUCTOR DEVICE AND METHOD OF MANUFACTURING THE SAME

(75) Inventor: Masayuki Miura, Ota-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 253 days.

(21) Appl. No.: 12/723,801

(22) Filed: Mar. 15, 2010

(65) Prior Publication Data

US 2010/0264539 A1 Oct. 21, 2010

(30) Foreign Application Priority Data

Apr. 16, 2009 (JP) .................................. 2009-100020

(51) Int. Cl.
*H01L 23/488* (2006.01)
*H01L 21/56* (2006.01)
*H01L 23/31* (2006.01)

(52) U.S. Cl. . 257/738; 257/737; 257/778; 257/E21.503; 438/124

(58) Field of Classification Search .................. 257/737, 257/738, E21.503, E23.023, E23.129, 778; 438/124, 123
See application file for complete search history.

(56) References Cited

U.S. PATENT DOCUMENTS

| 6,207,475 | B1 * | 3/2001 | Lin et al. | 438/108 |
| 6,674,016 | B2 * | 1/2004 | Kubo et al. | 174/260 |
| 6,677,179 | B2 * | 1/2004 | Yin et al. | 438/108 |
| 7,109,061 | B2 * | 9/2006 | Crane et al. | 438/118 |
| 2008/0036083 | A1 | 2/2008 | Sawada et al. | |

FOREIGN PATENT DOCUMENTS

| JP | 10-112476 | 4/1998 |
| JP | 2006-313826 | 11/2006 |
| JP | 2008-042077 | 2/2008 |

OTHER PUBLICATIONS

Japanese Office Action for Japanese Application No. 2009-100020 mailed on Aug. 7, 2012.

* cited by examiner

*Primary Examiner* — Roy Potter
(74) *Attorney, Agent, or Firm* — Turocy & Watson, LLP (57) ABSTRACT

The semiconductor device includes a wiring substrate having connection pads and a semiconductor chip having electrode pads. The semiconductor chip is mounted on the wiring substrate, and the electrode pads are connected to the connection pads via solder bumps. An underfill resin formed of a cured thermosetting resin is filled in a gap between the wiring substrate and the semiconductor chip. The underfill resin has a glass transition temperature which increases accompanying growth of crystal grains of the solder bumps.

19 Claims, 4 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2009-100020, filed on Apr. 16, 2009; the entire contents of which are incorporated herein by reference.

BACKGROUND OF THE INVENTION

To deal with pin multiplication, fine pitches, and increase in signal speed of semiconductor chips, there are used semiconductor devices adopting flip chip connection as a mounting method having short wiring and connection lengths. A semiconductor chip which is used for flip chip connection has electrode pads in an area shape and solder bumps formed thereon. A wiring substrate on which the semiconductor chip is mounted has connection pads formed at positions corresponding to the electrode pads of the semiconductor chip. The flip chip connection is a method for electrically and mechanically connecting the electrode pads of the semiconductor chip and the connection pads of the wiring substrate by aligning them to face each other and heating and melting the solder bumps.

In a gap between the wiring substrate and the semiconductor chip, an underfill resin formed of a thermosetting resin is filled for preventing a fatigue failure of the solder bumps due to thermal stress. By curing the thermosetting resin filled into the gap, a connection part with the solder bumps is protected. In the underfill resin, protection for the solder bumps decreases in a temperature region exceeding its glass transition temperature (glass transition point) Tg. In this aspect, it is considered that the glass transition temperature Tg of the underfill resin is preferred to be not lower than the upper limit value (125° C. for example) of operation guaranteed temperatures of the semiconductor chip (see JP-A 2008-042077 (KOKAI)).

However, in an underfill resin formed of a thermosetting resin having a high glass transition temperature Tg, thermal stress (residual stress) based on a temperature difference between the curing temperature and a temperature after cooled down increases. Accordingly, stress converges excessively to the electrode pads of the semiconductor chip, and thereby a crack can easily occur in an insulating protection film (such as a polyimide resin film) and an interlayer insulating film of the semiconductor chip. Particularly, when a low dielectric constant insulating film (low-k film) capable of reducing an inter-wiring capacity is used for the interlayer insulating film of the semiconductor chip, the low-k film itself has low strength and hence causes a problem that a crack or delamination can easily occur.

An underfill resin formed of a thermosetting resin with a glass transition temperature Tg lower than the upper limit value of operation guaranteed temperatures of the semiconductor chip (see JP-A 2006-313826 (KOKAI)) has a weakness of low protection for solder bumps. Particularly, when a *thermal cycle is applied to a semiconductor device adopting the flip chip connection for connecting a semiconductor chip and a wiring substrate, fatigue resistance of the solder bumps deteriorates because crystal grains grow by thermal stress and cause decrease in rigidity. The under fill resin having the low glass transition temperature Tg has poor protection for such solder bumps embrittled by thermal stress, and thus an open failure can easily occur due to a fatigue failure of the solder bumps.

BRIEF SUMMARY OF THE INVENTION

A semiconductor device according to an aspect of the present invention includes: a wiring substrate having a chip mounting area and connection pads arranged in the chip mounting area; a semiconductor chip, mounted on the chip mounting area of the wiring substrate, having electrode pads connected to the connection pads via solder bumps; and an underfill resin filled in a gap between the wiring substrate and the semiconductor chip and formed of a cured thermosetting resin, in which the underfill resin has a glass transition temperature which increases accompanying growth of crystal grains of the solder bumps.

A method of manufacturing a semiconductor device according to a first aspect of the present invention includes: preparing a wiring substrate having a chip mounting area and connection pads arranged in the chip mounting area; preparing a semiconductor chip having electrode pads and solder bumps formed on the electrode pads; disposing the semiconductor chip on the chip mounting area of the wiring substrate while aligning the electrode pads with the connection pads; heating to a temperature equal to or higher than a melting point of the solder bumps to connect the connection pads of the wiring substrate and the electrode pads of the semiconductor chip via the solder bumps; filling a thermosetting resin composition in a gap between the wiring substrate and the semiconductor chip; curing the thermosetting resin composition to form an underfill resin in the gap; and growing crystal grains of the solder bumps, in which a glass transition temperature of the underfill resin increases accompanying growth of the crystal grains of the solder bumps.

A method of manufacturing a semiconductor device according to a second aspect of the present invention includes: preparing a wiring substrate having a chip mounting area and connection pads arranged in the chip mounting area; preparing a semiconductor chip having electrode pads and solder bumps formed on the electrode pads; disposing the semiconductor chip on the chip mounting area of the wiring substrate while aligning the electrode pads with the connection pads; heating to a temperature equal to or higher than a melting point of the solder bumps to connect the connection pads of the wiring substrate and the electrode pads of the semiconductor chip via the solder bumps; filling a thermosetting resin composition in a gap between the wiring substrate and the semiconductor chip; curing the thermosetting resin composition to fabricate a semiconductor device by forming an underfill resin in the gap; and applying a thermal to the semiconductor device, in which a glass transition temperature of the underfill resin increases accompanying application of the thermal.

DETAILED DESCRIPTION OF THE INVENTION

Figure 1:
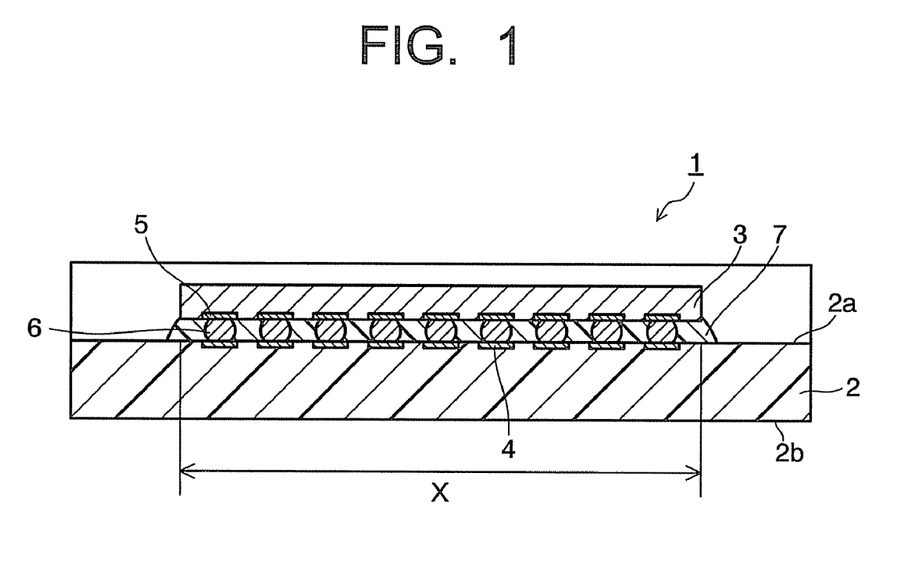
FIG. 1 is a cross-sectional view showing the structure of a semiconductor device according to an embodiment.

Hereinafter, a mode for implementing the present invention will be described. FIG. 1 is a cross-sectional view showing a structure of a semiconductor device according to an embodiment of the present invention. The semiconductor device 1 shown in FIG. 1 includes a wiring substrate 2 and a semiconductor chip 3 mounted on the wiring substrate. Connection pads 4 of the wiring substrate 2 and electrode pads 5 of the semiconductor chip 3 are connected electrically and mechanically by solder bumps 6. The semiconductor device 1 has a flip chip connection structure. The solder bumps 6 are connected to both of the electrode pads 5 of the semiconductor chip 3 and the connection pads 4 of the wiring substrate 2.

The wiring substrate 2 on which the semiconductor chip 3 is mounted is made such that a wiring network (wiring layer) is provided inside and on a surface of an insulating substrate such as a resin substrate, a ceramic substrate, or a glass substrate. As a specific example of the wiring substrate 2, there is a printed circuit board which is an insulating resin substrate formed of a glass-epoxy resin, BT resin (bismaleimide-triazine resin), or the like provided with a wiring network. The wiring substrate 2 has a first face 2a as a chip mounting face and a second face 2b opposite thereto.

The first face 2a of the wiring substrate 2 has a chip mounting area X. A plurality of connection pads 4 are arranged in the chip mounting area X. The connection pads 4 are arranged corresponding to an arrangement shape of the electrode pads 5 of the semiconductor chip 3. Incidentally, although omitted in FIG. 1, external connection terminals of the semiconductor device 1 are provided on the second face 2b of the wiring substrate 2. The external connection terminals are connected electrically to the connection pads 4 via the wiring network of the wiring substrate 2. When the semiconductor device 1 is used as a BGA package, metal balls such as solder balls are adopted as the external connection terminals, and when used as an LGA package, metal lands are adopted as the external connection terminals.

The semiconductor chip 3 has a plurality of electrode pads 5 provided on the side of a circuit forming face. The solder bumps 6 are formed respectively on the electrode pads 5. As a constituent material for the solder bumps 6, for example, a lead-free solder alloy such as Sn—Ag solder alloy, Sn—Cu solder alloy, Sn—Ag—Cu solder alloy, Sn—Bi solder alloy, or Sn—In solder alloy is used, or an Sn—Pb solder alloy is used. Among them, it is preferred to use the lead-free solder alloy containing substantially no lead (solder alloy containing no lead or containing lead in an amount to the extent that does not affect its environmental load (no more than 0.1% by mass)). The solder bumps 6 are formed by a plating method or using micro-balls formed of a solder alloy.

Although omitted in FIG. 1, the semiconductor chip 3 has a semiconductor substrate formed of an Si substrate or the like, a semiconductor element part having a semiconductor circuit formed thereon, and a circuit part constituted of metal wires and an interlayer insulating film. The circuit part has, for example, Cu wires and a low dielectric constant insulating film (low-k film) formed of an SiOF film, an SiOC film, an organic silica film, a porous film of one of these, or the like with a dielectric constant of 0.35 or less. The electrode pads 5 are connected electrically to metal wires (such as Cu wires) of the circuit part, and has an Al pad for example. On the circuit forming face of the semiconductor chip 3, a passivation film formed of an $SiO_x$, an $SiN_x$, or the like and an insulating protection film formed of a polyimide resin or the like are formed in a manner of exposing the electrode pads 5.

An underfill resin 7 is filled in the gap between the wiring substrate 2 and the semiconductor chip 3. The underfill resin 7 is formed of a thermosetting resin and is cured by curing treatment (thermosetting treatment). The solder bumps 6 are protected by the underfill resin 7 formed of such a cured thermosetting resin. As the underfill resin 7, a thermosetting resin such as epoxy resin, phenolic resin, silicon resin, polyimide resin, or the like is used. Among them, particularly the epoxy resin is preferred.

As will be described in detail later, in the underfill resin 7, a glass transition temperature Tg rises accompanying grain growth of the solder bumps 6 when the crystal grains of the solder bumps 6 grow by thermal (based on a high temperature leaving or a thermal cycle) applied to the semiconductor device 1. Specifically, the underfill resin 7 has a first glass transition temperature Tg1 immediately after curing treatment and a second glass transition temperature Tg2 after grain growth of the solder bumps 6. The second glass transition temperature Tg2 is higher than the first glass transition temperature Tg1 (Tg1<Tg2). It is assumed that the second glass transition temperature Tg2 of the underfill resin 7 indicates a glass transition temperature at the point when a grain boundary length of the solder bumps 6 immediately after curing treatment of the underfill resin 7 decreases to one-half (or grain growth by this amount).

The above-described flip chip connection between the wiring substrate 2 and the semiconductor chip 3 is implemented as follows for example. First, a flux for connection is applied as necessary on the chip mounting area X of the wiring substrate 2, and thereafter the semiconductor chip 3 having the solder bumps 6 is disposed thereon. After the electrode pads 5 are aligned with the connection pads 4 of the wiring substrate 2, the semiconductor chip 3 is disposed so that the solder bumps 6 provided on the electrode pads 5 contact the connection pads 4. Then by heating to a temperature equal to or higher than the melting point of the solder bumps 6, the connection pads 4 of the wiring substrate 2 and the electrode pads 5 of the semiconductor chip 3 are connected via the solder bumps 6.

A gap is made between the wiring substrate 2 and the semiconductor chip 3 based on the height of the solder bumps 6. An uncured thermosetting resin composition (liquid resin) to be the underfill resin 7 is filled in such a gap between the wiring substrate 2 and the semiconductor chip 3, and is cured by curing treatment to form the underfill resin 7 formed of the cured thermosetting resin. Thus, while protecting the solder bumps 6 with the underfill resin 7, the semiconductor chip 3 is fixed to the wiring substrate 2 to form the semiconductor device 1 shown in FIG. 1. On the second face 2b of the wiring substrate 2, external connection terminals are formed as necessary.

The semiconductor device 1 adopting the flip chip connection is required to maintain reliability of the connection part with the solder bumps 6 even when thermal based on the a high temperature leaving or a thermal cycle is applied. Specifically, as a reliability evaluation test of the semiconductor device 1, normally a thermal cycle test (TCT) is carried out between −55° C. and 125° C. as operation guaranteed temperatures of the semiconductor chip 3. After such a thermal cycle test is carried out (for example, a TCT with one cycle of −55° C. for 20 minutes→room temperature (25° C.) for 20 minutes→125° C. for 20 minutes), it is required that there occurs no open failure due to a crack, breakage, or the like in the connection part with the solder bumps 6.

When the above-described thermal cycle is applied to the semiconductor device 1, crystal grains of the solder bumps 6 grow by the thermal cycle and thermal stress based on this thermal cycle. The growth of crystal grains of the solder bumps 6 can be recognized by decrease in grain boundary length. The growth of crystal grains of the solder bumps 6 is recognized by EBSD analysis for example. The EBSD analysis is to perform orientation analysis of a crystalline sample using backscattering electron diffraction, and can obtain a plane direction (map), a grain boundary (map), and so on of crystal grains. The grain boundary length is calculated from the grain boundary map obtained from the EBSD analysis. The grain boundary length is the length of the boundary between adjacent crystal grains which are partitioned by a defined angle (direction difference). A "total grain boundary length" which is the grain boundary length for all direction differences decreases as the crystal grains of the solder bumps 6 grow.

Figure 2:
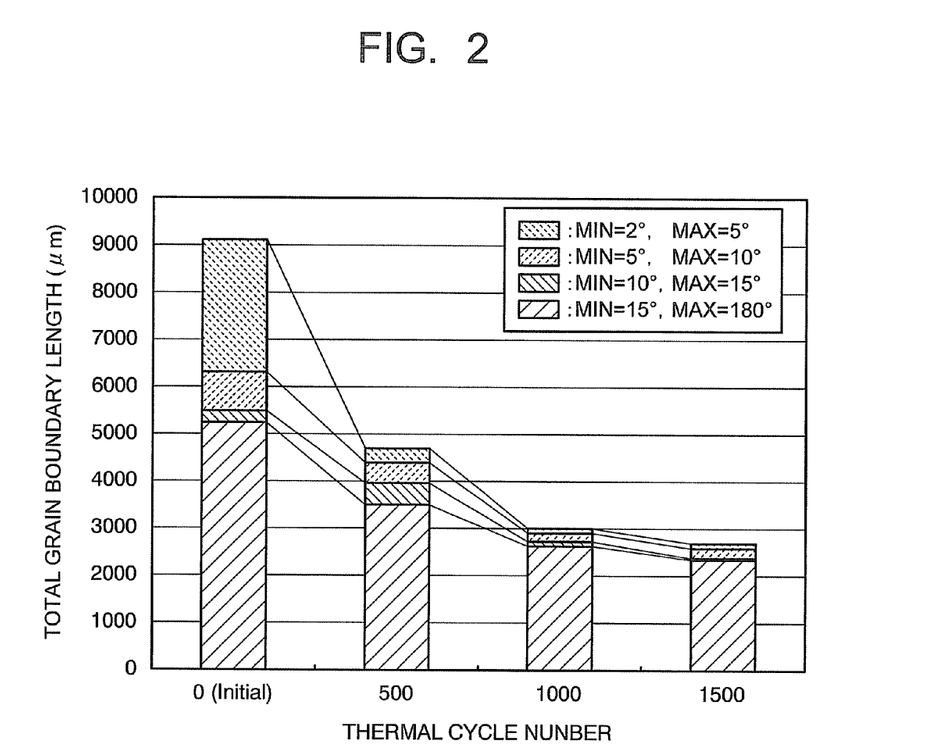
FIG. 2 is a graph showing an example in which a grain boundary length of solder bumps decreases by a thermal cycle test.

FIG. 2 illustrates how the grain boundary length (total grain boundary length) of the solder bumps 6 decreases by a thermal cycle test. The example illustrated in FIG. 2 shows a state that a thermal cycle ranging from −55° C. to 125° C. is applied to the solder bumps 6 formed of an Sn—Ag solder alloy, and the crystal grains are grown by thermal stress based on this thermal cycle. The grain boundary length shown in FIG. 2 is categorized by a direction difference partitioned when calculating the grain boundary length, the direction difference of crystal grains being measured in the range of 2° to 180°. The total grain boundary length which is a sum of grain boundary lengths with respect to all the direction differences tends to decrease with respect to given thermal stress. In the example shown in FIG. 2, the total grain boundary length decreases to one-half after applying 500 cycles of the thermal cycle from the state immediately after the curing treatment.

Accompanying the growth of crystal grains, the solder bumps 6 decreases in rigidity and becomes brittle. This deteriorates fatigue resistance of the solder bumps 6. By an underfill resin with the initial glass transition temperature Tg1 being low (Tg1<100° C.) and whose glass transition temperature Tg2 after the thermal cycle test does not change from the initial glass transition temperature Tg1 (Tg1=Tg2), it is not possible to obtain sufficient protection for the solder bumps 6 which is embrittled by thermal stress. Accordingly, a crack or a breakage can easily occur in the solder bumps 6. This means that an open failure occurs in the connection part with the solder bumps 6.

On the other hand, an underfill resin with the initial glass transition temperature Tg1 being high (125° C.≦Tg1) is excellent in protection for the solder bumps 6 in the thermal cycle test, but thermal stress (residual stress) increases based on the temperature difference between the treatment temperature in a curing treatment process of the underfill resin and the temperature after cooling. Accordingly, it leads to excessive stress convergence to the electrode pads 5 and so on of the semiconductor chip 3, and thereby a crack or delamination can easily occur in the insulating protection film (polyimide resin film or the like) and the interlayer insulating film of the semiconductor chip 3. Particularly, a crack or delamination can easily occur when a low-k film is adopted for the interlayer insulating film of the semiconductor chip 3.

When the crystal grains of the solder bumps 6 are grown by a heat cycle or thermal stress based on the heat cycle, the underfill resin 7 in the semiconductor device 1 increases in temperature from the first glass transition temperature Tg1 after curing to the second glass transition temperature Tg2 after grain growth. Increase of the glass transition temperature of the underfill resin 7 from Tg1 to Tg2 accompanying grain growth of the solder bumps 6 enables to suppress occurrence of a crack or delamination of the semiconductor chip 3 during curing treatment, and meanwhile to increase protection for the solder bumps (solder bumps with grown grains) 6 embrittled by a thermal cycle or thermal stress based on the thermal cycle. Therefore, it becomes possible to suppress occurrence of an open failure in the connection part with solder bumps 6. It is also the same as when the semiconductor device 1 leaves under high temperature.

The glass transition temperature Tg of the underfill resin 7 is a value measured by thermal analysis using a thermomechanical analysis device (TMA), a dynamic viscoelasticity measuring device (DMA), or the like. The glass transition temperature Tg in the TMA measurement can be obtained from a temperature characteristic curve of a thermal expansion amount. A test sample is increased in temperature by a certain ratio (for example, 10° C./minute), so as to measure temperature dependence of the thermal expansion amount in a thickness direction. The temperature characteristic curve to be obtained differs in inclination in a low temperature region at the glass transition temperature Tg and lower and in a high temperature region at the glass transition temperature Tg and higher. A tangent is drawn in each of these temperature regions with different inclinations. The glass transition temperature Tg is obtained as the cross point of two tangents.

The glass transition temperature Tg in the DMA measurement can be obtained by a loss tangent Tan δ of dynamic viscoelasticity. A sample is increased in temperature by a certain ratio (for example, 2° C./minute), so as to measure dynamic viscoelasticity. From a storage modulus (E') and a loss modulus (E") of the dynamic viscoelasticity, the glass transition temperature Tg is obtained as a peak temperature of a loss tangent Tan δ as a ratio (E"/E') of them. Incidentally, the dynamic viscoelasticity obtained by the DMA measurement can also be measured by a (nano-) indentation method to measure the intrusion amount of an indenter by applying a very small load to a diamond indenter to press a sample. While the shape of the sample is limited in the TMA and DMA due to the device structures, the indentation method is suitable for measuring a sample with a complicated shape or a minute sample.

Figure 3:
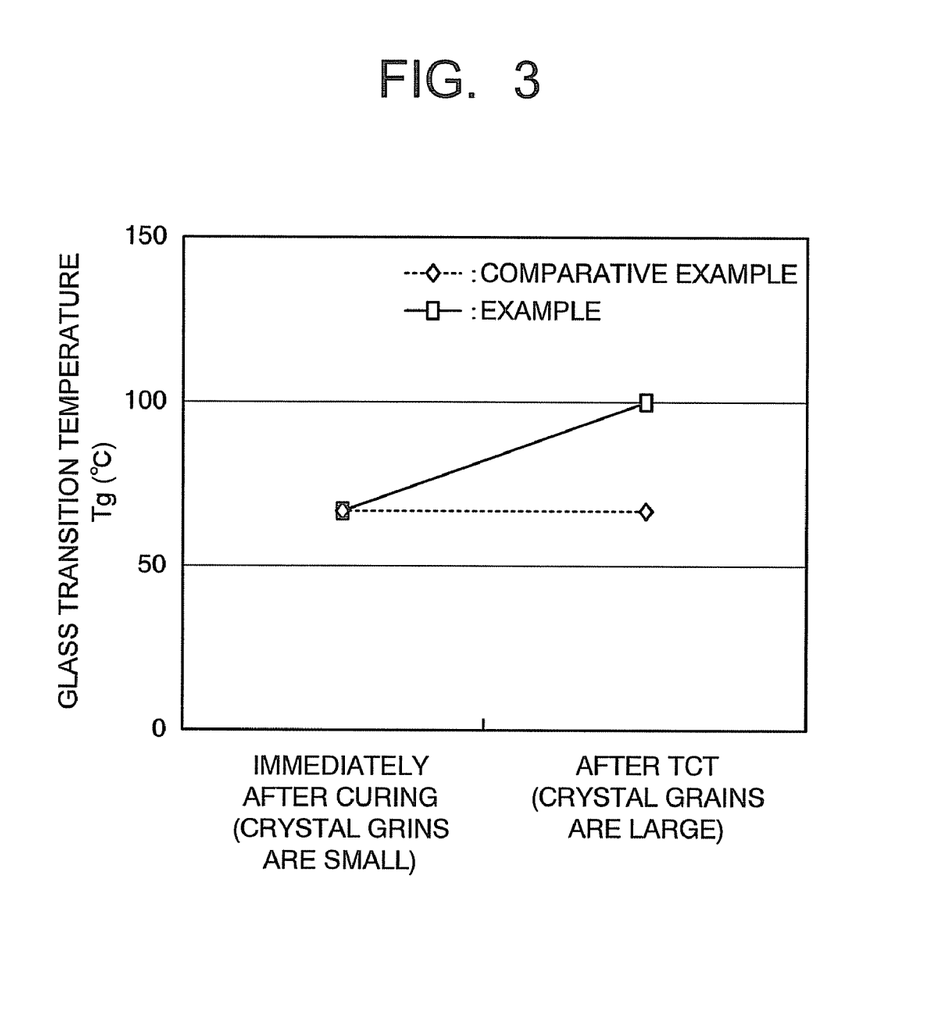
FIG. 3 is a chart showing a relation between a crystal grain size of solder bumps applied to the semiconductor device shown in FIG. 1 and a glass transition temperature Tg of an underfill resin.

FIG. 3 is a chart showing the first glass transition temperature Tg1 immediately after curing treatment of the underfill resin 7 (example) of the semiconductor device 1 and the second glass transition temperature Tg2 after grain growth of the solder bumps 6 by comparison with a conventional underfill resin (comparative example). An epoxy resin is used for both the example and the comparative example. The second glass transition temperature Tg2 is a glass transition temperature under the condition that the thermal cycle test with one cycle of −55° C. for 20 minutes→room temperature (25° C.) for 20 minutes→125° C. for 20 minutes is carried out until the grain boundary length of the solder bumps 6 decreases to one-half.

As is clear from FIG. 3, the first glass transition temperature Tg1 immediately after curing treatment of the underfill resin is about 67° C. in both the example and the comparative example. It can be seen that in the underfill resin of the comparative example, the second glass transition temperature Tg2 after grain growth of the solder bumps (after TCT) barely changes from the first glass transition temperature Tg1 immediately after curing, whereas in the underfill resin in the example the second glass transition temperature Tg2 after grain growth of the solder bumps (after TCT) increases to about 97° C. In the underfill resin 7 in the semiconductor device 1 of this embodiment, the glass transition temperature increases from the Tg1 immediately after curing to the Tg2 after grain growth accompanying grain growth of the solder bumps 6 based on thermal or thermal stress.

The second glass transition temperature Tg2 shown in FIG. 3 is a value measured according to the above-described measurement method (measurement by TMA). FIG. 3 shows values from measuring the glass transition temperature Tg of the underfill resin by TMA after applying 500 cycles of the thermal cycle to the solder bumps 6 formed of an Sn—Ag solder alloy, through which the total grain boundary length decreases to one-half from immediately after curing (initial length), that is, the thermal cycle ranging from −55° C. to 125° C. As shown in FIG. 3, it is recognized in the underfill resin 7 of the example that the glass transition temperature Tg increases from 67° C. (Tg1) to 97° C. (Tg2).

Figure 4:
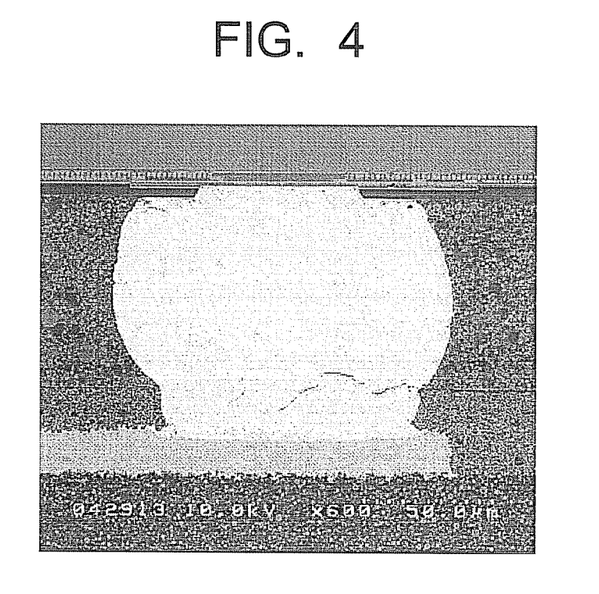
FIG. 4 is an enlarged picture showing the state of a solder bump after a thermal cycle test of a semiconductor device by an example.
Figure 5:
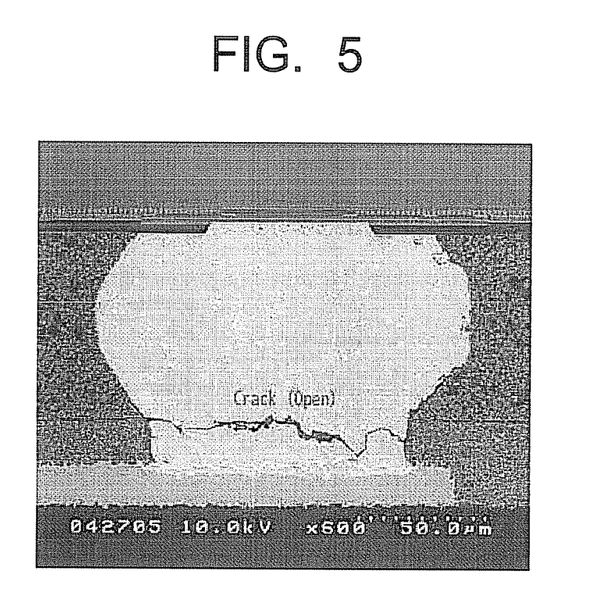
FIG. 5 is an enlarged picture showing the state of a solder bump after a thermal cycle test of a semiconductor device by a comparative example.

FIG. 4 is a cross-sectional picture showing a solder bump 6 after TCT in enlargement in the semiconductor device 1 using the underfill resin of the example. FIG. 5 is a cross-sectional picture showing a solder bump after TCT in enlargement in a semiconductor device using the underfill resin of the comparative example. As is clear from FIG. 4 and FIG. 5, in the semiconductor device using the underfill resin of the comparative example, a crack occurs in the solder bump after TCT and there is an open failure. On the other hand, no crack occurs in the solder bump after TCT in the semiconductor device using the underfill resin of the example, and it can be seen that the connection part with the solder bumps is highly reliable. This is based on improvement of protection of the solder bumps by the underfill resin, by increase of the glass transition temperature Tg of the underfill resin accompanying grain growth of the solder bumps.

In the semiconductor device 1 of this embodiment, since the glass transition temperature Tg of the underfill resin 7 increases from Tg1 (first glass transition temperature) to Tg2 (second glass transition temperature) accompanying crystal growth of the solder bumps 6, it is possible to enhance protection of the solder bumps 6 embrittled by a thermal cycle or thermal stress. Therefore, occurrence of an open failure in the connection part with the solder bumps 6 is suppressed. The underfill resin 7 is preferably one in which the second glass transition temperature Tg2 increases from the first glass transition temperature Tg1 by 5% or more (1.05Tg1≦Tg2). When the increase ratio from the first glass transition temperature Tg1 to the second glass transition temperature Tg2 is less than 5%, it is not possible to sufficiently enhance protection of the solder bumps 6 after grain growth by the underfill resin 7.

Furthermore, the first glass transition temperature Tg1 of the underfill resin 7 is preferably lower than 110° C. When the first glass transition temperature Tg1 of the underfill resin 7 is 110° C. or higher, thermal stress (residual stress) in curing treatment increases, and a crack, delamination, or the like can easily occur in the insulating protection film and the interlayer insulating film of the semiconductor chip 3. For further reducing stress application to the semiconductor chip 3 in curing treatment of the underfill resin 7, the first glass transition temperature Tg1 of the underfill resin 7 is more preferably 100° C. or lower.

However, when the first glass transition temperature Tg1 of the underfill resin 7 is too low, it is possible that the second glass transition temperature Tg2 after grain growth cannot be increased sufficiently even when the glass transition temperature Tg of the underfill resin 7 increases accompanying grain growth of the solder bumps 6. In this aspect, the first glass transition temperature Tg1 of the underfill resin 7 is preferably 60° C. or higher. The first glass transition temperature Tg1 of the underfill resin 7 is preferably lower than 110° C., and more preferably in the range of 60° C. to 100° C.

The second glass transition temperature Tg2 of the underfill resin 7 after grain growth of the solder bumps 6 is preferably lower than 125° C. When the second glass transition temperature Tg2 is 125° C. or higher, stress applied to the electrode pads 5 or the like of the semiconductor chip 3 during TCT increases, and a crack or delamination can easily occur in the insulating protection film and the interlayer insulating film of the semiconductor chip 3. For suppressing a crack or delamination in the semiconductor chip 3 with high reproducibility, the second glass transition temperature Tg2 of the underfill resin 7 is more preferably 120° C. or lower.

However, when the second glass transition temperature Tg2 of the underfill resin 7 is too low, protection of the solder bumps 6 cannot be increased sufficiently. Specifically, protection of the solder bumps 6 by the underfill resin 7 decreases, which makes it possible that a crack easily occurs in the solder bumps 6. Accordingly, the second glass transition temperature Tg2 of the underfill resin 7 is preferably 90° C. or higher. The second glass transition temperature Tg2 of the underfill resin 7 is preferably lower than 125° C., and more preferably ranging from 90° C. to 120° C.

The above-described preferable ranges of the first glass transition temperature Tg1 after curing treatment of the underfill resin 7 and the second glass transition temperature Tg2 after grain growth of the solder bumps 6 are on the assumption that the first glass transition temperature Tg1 and the second glass transition temperature Tg2 satisfy the relation of Tg1<Tg2. The first glass transition temperature Tg1 and the second glass transition temperature Tg2 of the underfill resin 7 are more preferred to satisfy the relation of 1.05Tg1≦Tg2.

The underfill resin 7 with the glass transition temperature Tg that increases accompanying grain growth of the solder bumps 6 can be achieved by adopting, for example, a thermosetting resin that is not completely cured in curing treatment. With respect to the thermosetting resin that is not completely cured, an example of the case where the underfill resin 7 is formed of an epoxy resin will be described. The state not completely cured refers to a state that reaction of the epoxy resin and a curing agent can proceed slightly after curing treatment under the curing condition of a typical epoxy resin (150° C. to 165° C. for 2 hours).

The thermosetting epoxy resin composition is formed generally by mixing an epoxy resin as a main agent with at least one curing agent selected from phenols such as phenol resin, acid anhydrides such as linear chain aliphatic acid anhydride, annular aliphatic acid anhydride, and aromatic acid anhydride, and amines such as aliphatic amine, aromatic amine, polyamine, and polyamide. It is needless to mention that the epoxy resin composition may contain general fillers and additives, specifically, inorganic fillers such as silica, alumina, and calcium carbonate, a coloring agent, and a coupling agent.

Among the above-described curing agents, an accelerator such as imidazole is used together when the phenols and the acid anhydrides are used. The accelerator is generally added to allow completion of reaction of the epoxy resin with phenols and anhydrides. By reducing the addition amount of such an accelerator and delaying the reaction rate of the epoxy resin with the phenols and the anhydrides, the underfill resin 7 formed of a thermosetting resin that is not completely cured after curing treatment is obtained. In such an underfill resin 7, the glass transition temperature Tg after curing treatment is suppressed low, and the curing reaction advances by a thermal cycle or thermal stress that causes grain -growth of the solder bumps 6. Thus, the glass transition temperature Tg increases accompanying grain growth of the solder bumps 6.

When the curing agent formed of an amine is used, generally the accelerator is not used because the amine react directly with the epoxy resin. The amine as a curing agent is added generally in an amount or more that is capable of completing reaction of the epoxy resin so that a non-reacted epoxy resin does not remain after curing treatment. By decreasing the addition amount of such an amine (curing agent) and adding the amount of amine less than the amount of epoxy resin, reaction of the epoxy resin with the amine can be delayed. Further, the reaction rate with the epoxy resin differs also depending on the molecular weight and structure of the amine. For example when a polyamine is used, the reaction rate can be lowered as the molecular weight gets larger and more by a linear chain in terms of structure.

By controlling the addition amount, the molecular weight, and the structure of the amine as a curing agent to lower the reaction rate of the epoxy resin with the amine as a curing agent, the underfill resin 7 formed of a thermosetting resin that is not completely cured after curing treatment is obtained. In such an underfill resin 7, the glass transition temperature Tg after curing treatment is suppressed low, and curing reaction proceeds by a thermal cycle or thermal stress that causes grain growth of the solder bumps 6. Thus, the glass transition temperature Tg increases accompanying grain growth of the solder bumps 6.

Specific examples of the epoxy resin forming the underfill resin 7 includes an epoxy resin composition containing 5% to 15% by mass of N,N-bis(2,3-epoxy propyl)-4-(2,3-epoxypropoxy)aniline, 5% to 15% by mass of bisphenol F liquid epoxy resin, 3.8% by mass of bisphenol A liquid epoxy resin, 5% to 10% by mass of amine curing agent, 1% or less by mass of carbon black, 60% to 70% by mass of silica, and 5% or less by mass of additive, and an epoxy resin composition containing 15% to 25% by mass of bisphenol F liquid epoxy resin, 5% to 10% by mass of 1,6-bis(2,3-epoxypropoxy)naphthalene, 5% to 10% by mass of amine curing agent, 1% or less by mass of carbon black, 55% to 65% by mass of silica, and 5% or less by mass of additive.

Although the case where the epoxy resin is used as the underfill resin 7 has been described here, the underfill resin 7 in which the glass transition temperature Tg increases accompanying crystal growth of the solder bumps 6 can be achieved by controlling similarly the type and amount of a curing agent, also when using a different thermosetting resin. As the thermosetting resin other than the epoxy resin, there are phenol resin, silicone resin, and polyimide resin to name a few.

It should be noted that the present invention is not limited to the above-described embodiment, and may be applied to semiconductor devices of various structures in which a wiring board and a semiconductor chip are connected by flip chip connection and an underfill resin formed of a thermosetting resin is filled in the gap therebetween. Such semiconductor devices are also included in the present invention. Further, the embodiment of the present invention can be extended or modified within the range of the technical idea of the present invention, and such extended and/or modified embodiments are included in the technical scope of the present invention.

What is claimed is:
1. A semiconductor device, comprising:
    a wiring substrate having a chip mounting area and connection pads arranged in the chip mounting area;
    a semiconductor chip, mounted on the chip mounting area of the wiring substrate, having electrode pads connected to the connection pads via solder bumps; and
    an underfill resin filled in a gap between the wiring substrate and the semiconductor chip and formed of a cured thermosetting resin,
    wherein the underfill resin has a glass transition temperature which increases accompanying growth of crystal grains of the solder bumps.
2. The semiconductor device according to claim 1,
    wherein the underfill resin has a first glass transition temperature Tg1 after curing and a second glass transition temperature Tg2 after increasing accompanying growth of the crystal grains of the solder bumps, and the second glass transition temperature Tg2 satisfies a relation of 1.05Tg1≦Tg2 with the first glass transition temperature Tg1.
3. The semiconductor device according to claim 2,
    wherein the second glass transition temperature Tg2 is a glass transition temperature of the underfill resin at a point when a grain boundary length of the solder bumps decreases to one-half from a state that the thermosetting resin is cured.
4. The semiconductor device according to claim 2,
    wherein the first glass transition temperature Tg1 is lower than 110° C., and the second glass transition temperature Tg2 is lower than 125° C.
5. The semiconductor device according to claim 2,
    wherein the first glass transition temperature Tg1 is in a range from 60° C. to 100° C., and the second glass transition temperature Tg2 is in a range from 90° C. to 125° C.
6. The semiconductor device according to claim 1,
    wherein the solder bumps are formed of a lead-free solder alloy.
7. A method of manufacturing a semiconductor device, comprising:
    preparing a wiring substrate having a chip mounting area and connection pads arranged in the chip mounting area;
    preparing a semiconductor chip having electrode pads and solder bumps formed on the electrode pads;
    disposing the semiconductor chip on the chip mounting area of the wiring substrate while aligning the electrode pads with the connection pads;
    heating to a temperature equal to or higher than a melting point of the solder bumps to connect the connection pads of the wiring substrate and the electrode pads of the semiconductor chip via the solder bumps;
    filling a thermosetting resin composition in a gap between the wiring substrate and the semiconductor chip;
    curing the thermosetting resin composition to form an underfill resin in the gap; and
    growing crystal grains of the solder bumps,
    wherein a glass transition temperature of the underfill resin increases accompanying growth of the crystal grains of the solder bumps.
8. The manufacturing method according to claim 7, wherein the underfill resin has a first glass transition temperature Tg1 after curing and a second glass transition temperature Tg2 after increasing accompanying growth of the crystal grains of the solder bumps, and the second glass transition temperature Tg2 satisfies a relation of 1.05Tg1≦Tg2 with the first glass transition temperature Tg1.
9. The manufacturing method according to claim 8,
    wherein the first glass transition temperature Tg1 is lower than 110° C., and the second glass transition temperature Tg2 is lower than 125° C.

10. The manufacturing method according to claim 8,
wherein the first glass transition temperature Tg1 is in a range from 60° C. to 100° C., and the second glass transition temperature Tg2 is in a range from 90° C. to 125° C.

11. The manufacturing method according to claim 7,
wherein the crystal grains of the solder bumps are grown so that a grain boundary length thereof becomes one-half.

12. The manufacturing method according to claim 7,
wherein the thermosetting resin composition is not cured completely at a stage when the underfill resin is formed.

13. The manufacturing method according to claim 7,
wherein the thermosetting resin composition is formed of an epoxy resin composition.

14. A method of manufacturing a semiconductor device, comprising:
preparing a wiring substrate having a chip mounting area and connection pads arranged in the chip mounting area;
preparing a semiconductor chip having electrode pads and solder bumps formed on the electrode pads;
disposing the semiconductor chip on the chip mounting area of the wiring substrate while aligning the electrode pads with the connection pads;
heating to a temperature equal to or higher than a melting point of the solder bumps to connect the connection pads of the wiring substrate and the electrode pads of the semiconductor chip via the solder bumps;
filling a thermosetting resin composition in a gap between the wiring substrate and the semiconductor chip;
curing the thermosetting resin composition to fabricate a semiconductor device by forming an underfill resin in the gap; and
applying thermal energy to the semiconductor device,
wherein a glass transition temperature of the underfill resin increases accompanying application of the thermal energy, and
wherein the underfill resin has a first glass transition temperature Tg1 after curing and a second glass transition temperature Tg2 after increasing accompanying application of the thermal energy, and the second glass transition temperature Tg2 satisfies a relation of $1.05 Tg1 \leq Tg2$ with the first glass transition temperature Tg1.

15. The manufacturing method according to claim 14,
wherein the thermal energy is applied by a thermal cycle.

16. The manufacturing method according to claim 14,
wherein the first glass transition temperature Tg1 is lower than 110° C., and the second glass transition temperature Tg2 is lower than 125° C.

17. The manufacturing method according to claim 14,
wherein the first glass transition temperature Tg1 is in a range from 60° C. to 100° C., and the second glass transition temperature Tg2 is in a range from 90° C. to 125° C.

18. The manufacturing method according to claim 14,
wherein crystal grains of the solder bumps grow by application of the thermal energy.

19. The manufacturing method according to claim 14,
wherein the thermosetting resin composition is not cured completely at a stage when the underfill resin is formed.

* * * * *